(12) United States Patent
Iwasaki

(10) Patent No.: US 9,078,369 B2
(45) Date of Patent: Jul. 7, 2015

(54) FASTENING DEVICE, CASING USING SAME, AND FASTENING METHOD

(75) Inventor: Fuminobu Iwasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 288 days.

(21) Appl. No.: 13/336,367

(22) Filed: Dec. 23, 2011

(65) Prior Publication Data

US 2012/0090157 A1  Apr. 19, 2012

Related U.S. Application Data

(63) Continuation of application No. PCT/JP2009/061969, filed on Jun. 30, 2009.

(51) Int. Cl.
*H05K 7/14* (2006.01)
*F16B 5/02* (2006.01)

(52) U.S. Cl.
CPC ......... H05K 7/1489 (2013.01); *Y10T 29/49948* (2015.01); *F16B 5/02* (2013.01)

(58) Field of Classification Search
CPC ........ F16B 5/02; F16B 5/0258; F16B 5/0275; F16B 29/00; H05K 7/1485; H05K 7/1488; H05K 7/1489; Y10T 29/49948
USPC ........... 29/525.02, 525.11, 243.5; 411/15, 22, 411/32, 34, 38, 44, 57.1; 312/257.1, 263, 312/264, 265.5, 265.6
See application file for complete search history.

(56) References Cited

U.S. PATENT DOCUMENTS

| | | | | |
|---|---|---|---|---|
| 4,540,222 A | * | 9/1985 | Burrell | 312/257.1 |
| 4,579,491 A | * | 4/1986 | Kull | 411/43 |
| 4,656,806 A | * | 4/1987 | Leibhard et al. | 52/704 |
| 4,919,577 A | * | 4/1990 | Binns | 411/43 |
| 5,250,752 A | * | 10/1993 | Cutright | 174/363 |
| 5,816,761 A | * | 10/1998 | Cassatt et al. | 411/34 |
| 6,273,655 B1 | * | 8/2001 | McAlpine et al. | 411/34 |
| 6,537,004 B2 | * | 3/2003 | Cosenza et al. | 411/34 |

(Continued)

FOREIGN PATENT DOCUMENTS

| CN | 2498393 Y | 7/2002 |
|---|---|---|
| CN | 2813971 Y | 9/2006 |

(Continued)

OTHER PUBLICATIONS

Chinese Search Report mailed Apr. 19, 2013 for corresponding Chinese Application No. 2009801601313.

(Continued)

*Primary Examiner* — Christopher M Koehler
(74) *Attorney, Agent, or Firm* — Staas & Halsey LLP

(57) ABSTRACT

A fastening device includes: a screw member that is penetrated through the attachment holes; and a fastening member holding portion, wherein the fastening member holding portion includes: a first surface engagement portion that is located at a first surface side of the plurality of members overlapping each other, and that is engaged with the first surface; an extension portion that extends from the first surface engagement portion to a second surface side as a rear side of the first surface; a second surface engagement portion that is located at the second surface side, and that is engaged with the second surface; and a screw portion that moves the second surface engagement portion to the first surface engagement portion side in response to rotation of the screw member.

4 Claims, 9 Drawing Sheets

(56) References Cited

U.S. PATENT DOCUMENTS

| | | | |
|---|---|---|---|
| 6,547,500 B2 * | 4/2003 | Cosenza et al. | 411/34 |
| 6,868,590 B2 * | 3/2005 | Bentrim | 24/458 |
| 6,997,530 B2 * | 2/2006 | Avendano et al. | 312/401 |
| 2005/0025602 A1 * | 2/2005 | Huang | 411/57.1 |
| 2006/0062650 A1 * | 3/2006 | Keener | 411/34 |
| 2008/0272677 A1 | 11/2008 | Francisquini | |
| 2012/0237313 A1 * | 9/2012 | Bohnet et al. | 411/15 |
| 2013/0061451 A1 * | 3/2013 | Pratt | 29/525.02 |

FOREIGN PATENT DOCUMENTS

| | | |
|---|---|---|
| JP | 54-84466 | 6/1979 |
| JP | 61-144410 | 7/1986 |
| JP | 1-124411 | 8/1989 |
| JP | 2001-127465 | 5/2001 |
| JP | 2002-130231 | 5/2002 |
| JP | 2007-507862 | 3/2007 |
| KR | 0125229 | 6/1998 |

OTHER PUBLICATIONS

International Search Report for PCT/JP2009/061969 mailed Oct. 13, 2009.

Korean Office Action mailed Feb. 15, 2013 in corresponding Patent Application No. 10-2011-7031473.

* cited by examiner

FIG. 5A
FIG. 5B
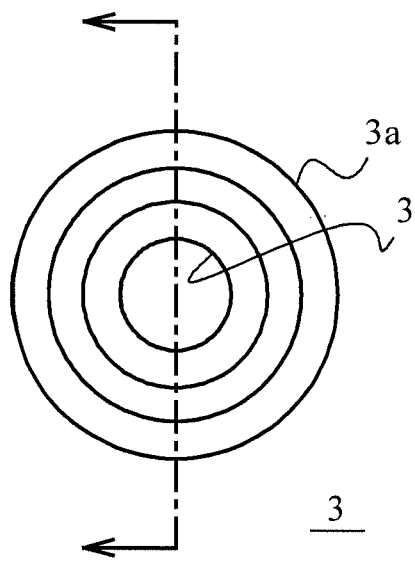
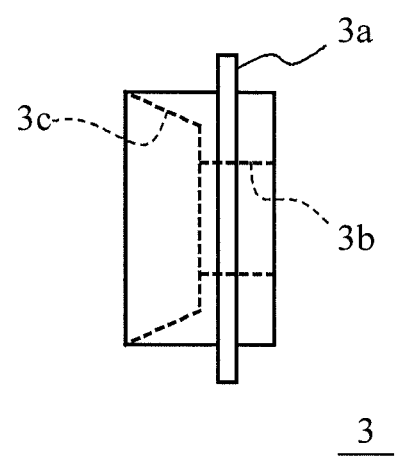
FIG. 5C
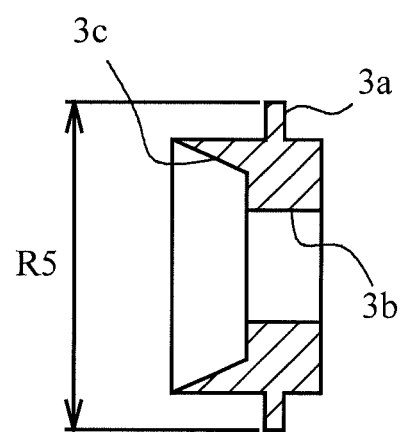

FASTENING DEVICE, CASING USING SAME, AND FASTENING METHOD

CROSS-REFERENCE TO RELATED APPLICATIONS

This application is a continuation application of PCT/JP2009/061969, filed on Jun. 30, 2009, the entire contents of which are incorporated herein by reference.

FIELD

The embodiments discussed herein are related to a fastening device, a casing using the same, and a fastening method.

BACKGROUND

In a case where a cabinet, a rack device, or the like on which an electronic device is mounted is assembled, a rail member is fastened between standing pillar members in a horizontal manner. Conventionally, there is proposed an improvement in fastening the pillar member and the rail member (Japanese National Publication of International Patent Application No. 2007-507862). Also, there is proposed a board anchor that may be used for the fastening the pillar member and the rail member (Japanese Laid-open Utility Model Publication No. 1-124411).

Incidentally, in a case where the pillar member and the rail member are fastened to each other, a head portion of a screw used for the fastening is typically located at the outside of the pillar member. For example, the rail member is brought into pressure contact with a wall surface of the pillar member, a male screw is inserted from a rear side of the wall surface with which the rail member is brought into contact, that is, from the outside (front side) of the pillar member, and the head portion of the male screw is rotated to fasten both members. In such a way, when the head portion of the screw is located at the outside of the pillar member, it may be difficult for an operator to solely fasten the pillar member and the rail member. In order for the operator to solely fasten both members, the screw has to be inserted from the outside of the pillar member and the head portion has to be rotated and tightened with the rail member held to be brought into contact with the pillar member. It is very difficult to perform such an operation. Thus, operators make a pair to typically fasten the pillar member and the rail member. There is such a problem not only in a fastening operation of the pillar member and the rail member but also in a fastening operation of plural members.

SUMMARY

According to an aspect of the embodiments, a fastening device for fastening a plurality of members which overlap each other, and each of which includes an attachment hole, the fastening device includes: a screw member that is penetrated through the attachment holes; and a fastening member holding portion, wherein the fastening member holding portion includes: a first surface engagement portion that is located at a first surface side of the plurality of members overlapping each other, and that is engaged with the first surface; an extension portion that extends from the first surface engagement portion to a second surface side as a rear side of the first surface; a second surface engagement portion that is located at the second surface side, and that is engaged with the second surface; and a screw portion that moves the second surface engagement portion to the first surface engagement portion side in response to rotation of the screw member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A is a front view, FIG. 4B is a side view, and FIG. 4C is a sectional view;

FIGS. 5A to 5C are explanatory views of a second member, FIG. 5A is a front view, FIG. 5B is a side view, and FIG. 5C is a sectional view;

DESCRIPTION OF EMBODIMENTS

Figure 1:
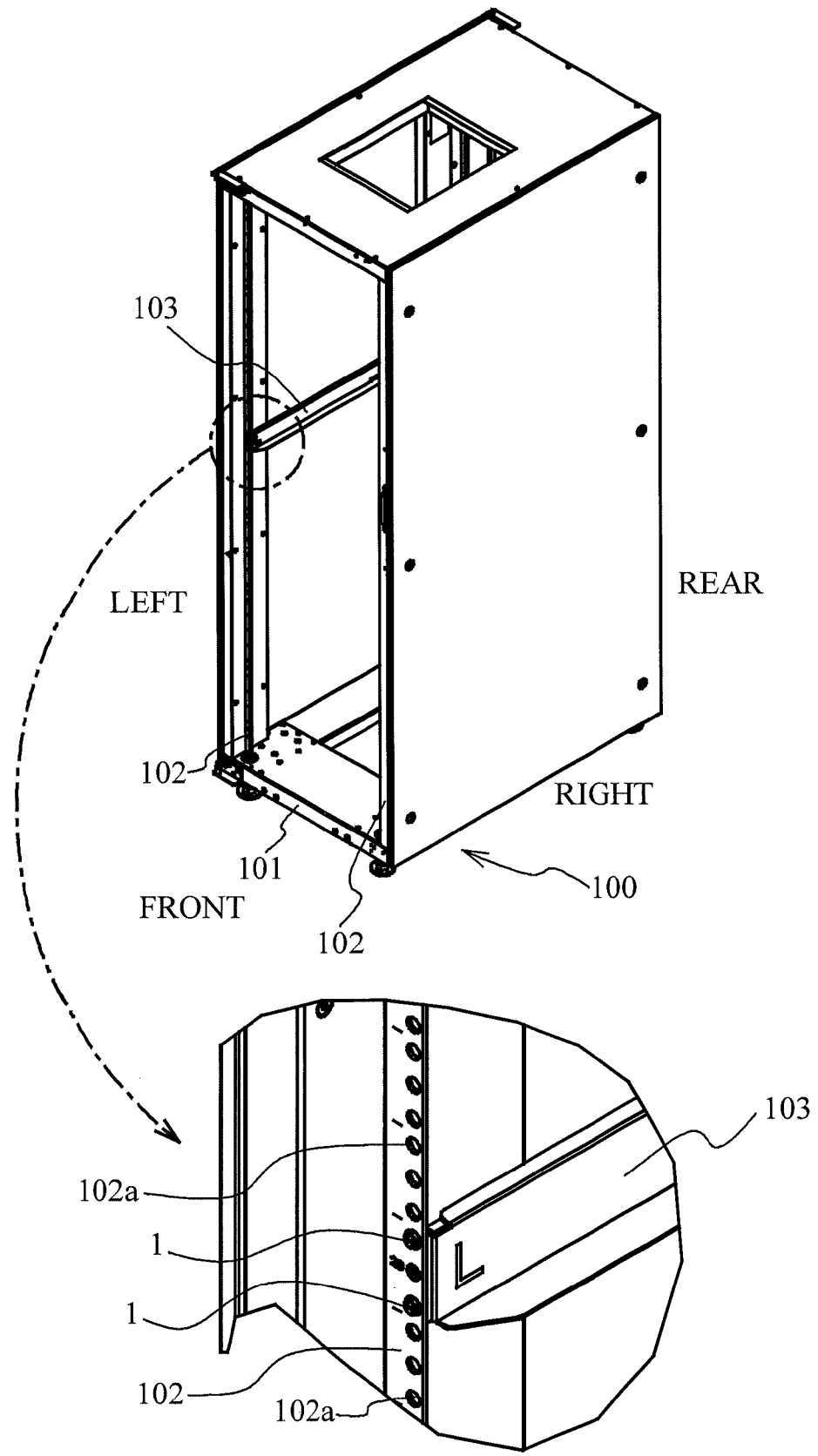
FIG. 1 is a perspective view of a rack device of an embodiment.

The embodiment according to the present invention will be described below with reference to the accompanying drawings. Herein, a ratio and a dimension of each component illustrated in the drawings may not correspond to the actual one. Also, in some cases, details may be omitted in the drawings.

Embodiment

FIG. 1 is a perspective view of a rack device 100 as an example of a casing. The rack device 100 includes plural pillar members 102 standing on a pedestal portion 101. A rail member 103 extending in the horizontal direction is fastened to the pillar members 102. The pillar member 102 and the rail member 103 are fastened to each other with overlapping each other. An electronic device such as a server is arranged on the rail member 103 fastened to the pillar members 102. Additionally, the front, the rear, the left, and the right of the rack device 100 are indicated in FIG. 1 to facilitate the following explanation.

Figure 2:
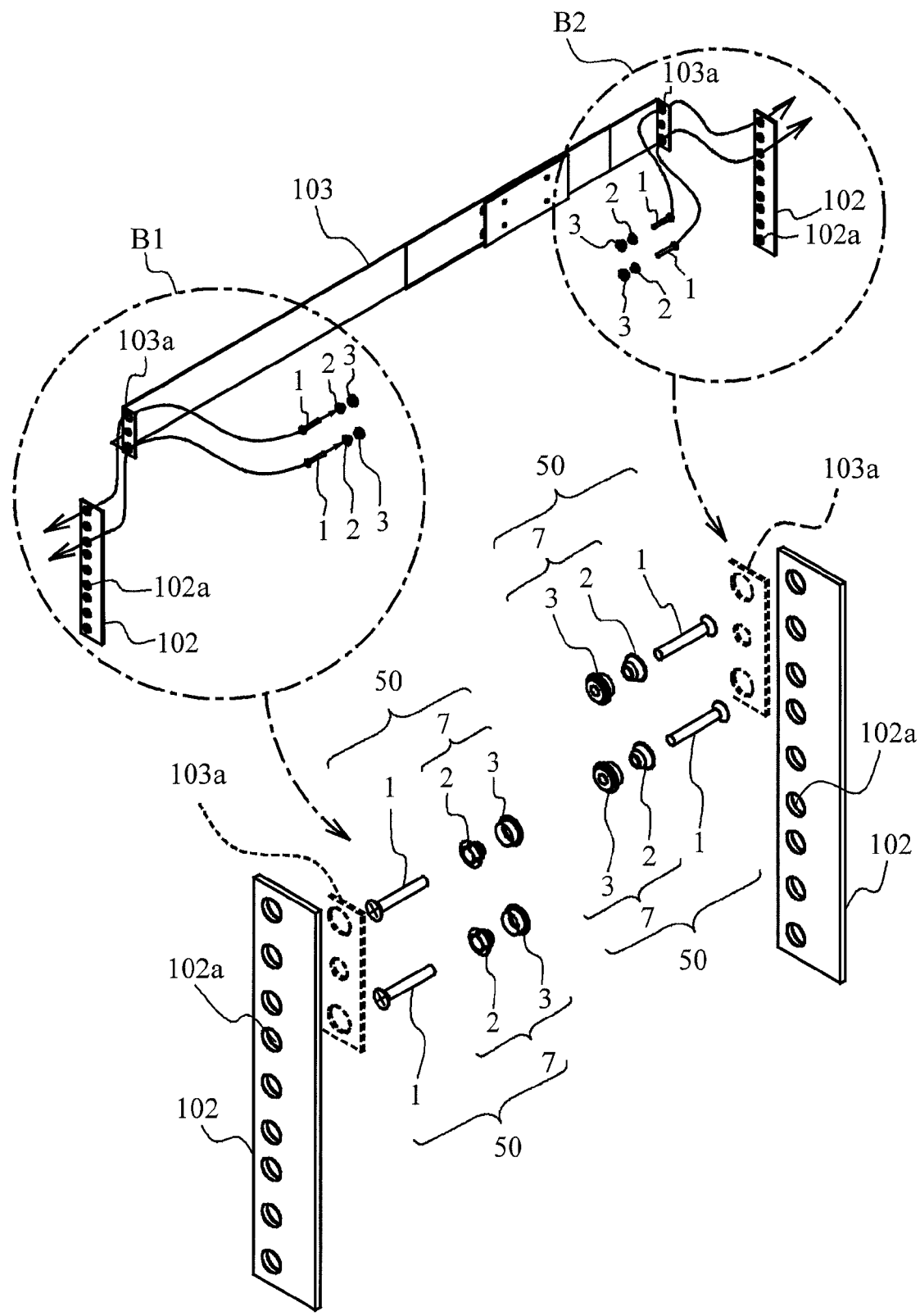
FIG. 2 is a perspective view of pillar members and a rail member before assembling.
Figure 3:
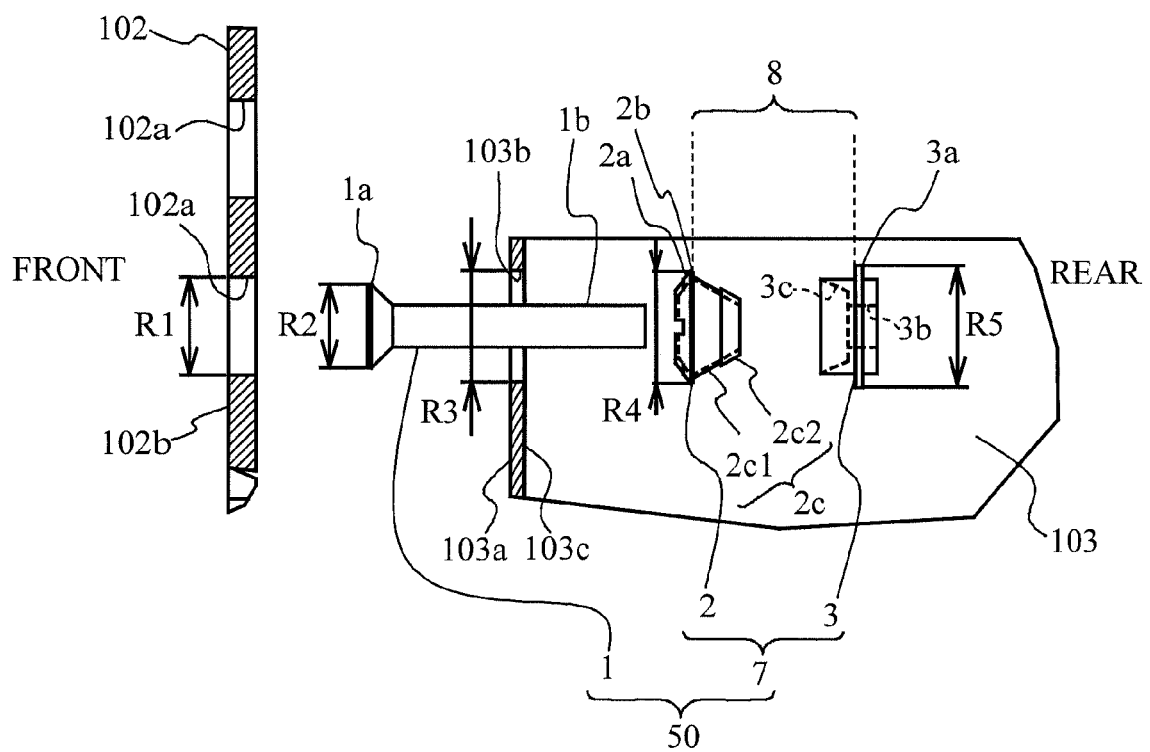
FIG. 3 is an explanatory view of a fastening device before a temporary fastened state.

FIG. 2 is a perspective view of the pillar members 102 and the rail member 103 before the fastened state. Fastening devices 50 are used for fastening the pillar members 102 and the rail member 103 as illustrated in FIGS. 2 and 3. FIG. 3 is an explanatory view of the fastening device 50 before a temporary fastened state.

The pillar member 102 includes attachment holes 102a for fastening the rail member 103 as illustrated in FIGS. 1 to 3. The plural attachment holes 102a are arranged in the vertical direction. The diameter of the attachment hole 102a provided in the pillar member 102 is set to R1 as illustrated in FIG. 3. Also, the rail member 103 includes a flange portion 103a with which the pillar member 102 is brought into contact as illustrated in FIGS. 2 and 3. This flange portion 103a is provided with attachment holes 103b for fastening the pillar member 102 in the vertical direction. The diameter of the attachment hole 103b provided in the flange portion 103a is set to R3. The diameter R3 is larger than the diameter R1.

Herein, a first surface 102b represents a front surface of the pillar member 102 fastened by the fastening device 50 as illustrated in FIG. 3. Also, a second surface 103c represents a rear surface of the flange portion 103a of the rail member 103 fastened by the fastening device 50 as illustrated in FIG. 3. That is, the second surface 103c is a rear side of the first page 102b.

As illustrated in FIGS. 2 and 3, the fastening device 50 includes: a screw member 1 penetrating through the attachment holes 102a and 103b; and the fastening member holding portion 7. The fastening member holding portion 7 holds the pillar member 102 and the rail member 103 to be fastened. The fastening member holding portion 7 includes a first member 2 and a second member 3 which can be separated from each other. The screw member 1 includes a head portion 1a and a male screw portion 1b. The diameter of the head portion 1a is set to R2. The diameter R2 is smaller than the diameter R1.

Figure 4A:
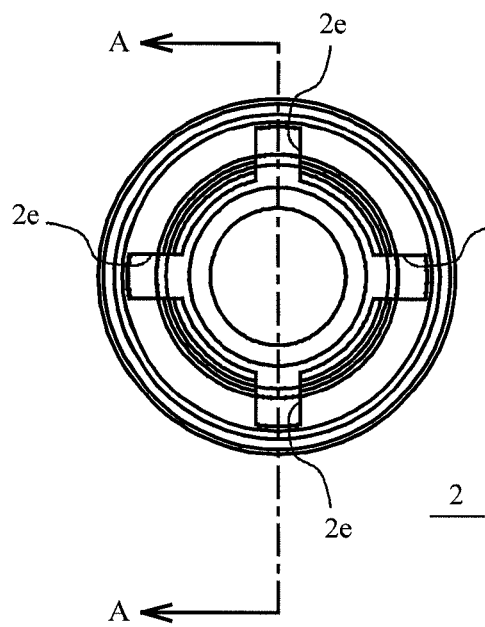
FIGS. 4A to 4C are explanatory views of a first member.
Figure 4B:
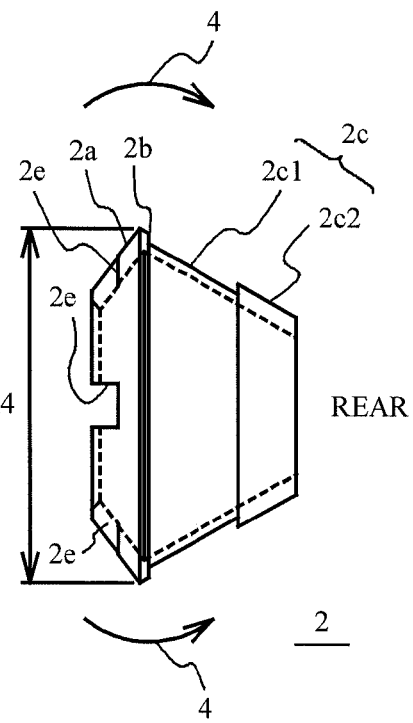
Figure 4C:
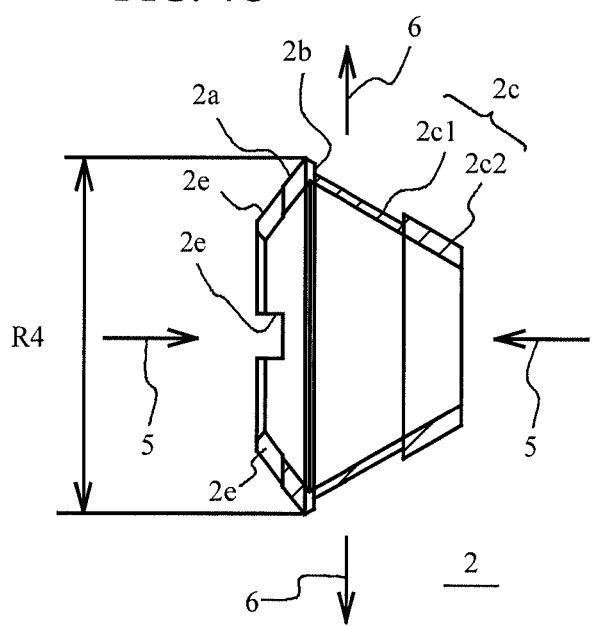

FIGS. 4A to 4C are explanatory views of the first member 2, FIG. 4A is a front view, FIG. 4B is a side view, and FIG. 4C is a sectional view. Further, FIG. 5A to 5C are explanatory views of the second member 3, FIG. 5A is a front view, FIG. 5B is a side view, and FIG. 5C is a sectional view.

The fastening member holding portion 7 includes a first surface engagement portion 2a located at the first surface 102b side of the overlapped members. Specifically, the fastening member holding portion 7 includes the first surface engagement portion 2a which is located at the first surface 102b side of the pillar member 102 and the rail member 103 in the accomplished fastened state, and which is engageable with the first surface 102b. The first surface engagement portion 2a is provided in the first member 2 as illustrated in FIGS. 3 and 4B. The first member 2 includes an extension portion 2c extending from the first surface engagement portion 2a to the second surface 103c as the rear side of the first surface 102b. The diameter of the first surface engagement portion 2a is set to R4. The diameter R4 is slightly larger than the diameter R1, and smaller than the diameter R3. The first member 2 is made of stainless steel (SUS304). The first member 2 is requested to be elastically deformable as will be described later, and may be made of any material satisfying such a condition.

The fastening member holding portion 7 includes a second surface engagement portion 3a located at the second surface 103c side of the plural overlapped members. Specifically, the fastening member holding portion 7 includes the second surface engagement portion 3a which is located at the second surface 103c side of the pillar member 102 and the rail member 103 in the accomplished fastened state, and which is engageable with the second surface 103c. Also, the fastening member holding portion 7 includes a screw portion 3b which moves the second surface engagement portion 3a toward the first surface engagement portion 2a side in response to the rotation of the screw member 1. The screw member 1 is tightened, whereby the screw portion 3b compresses the extension portion 2c. The screw portion 3b and the second surface engagement portion 3a are provided in the second member 3 as illustrated in FIGS. 3 and 5B. Like the first member 2, the second member 3 is made of stainless steel (SUS304), but may be made of another material as necessary.

Herein, a description will, be given of the first member 2 included in the fastening member holding portion 7 in more detail with reference to FIG. 4.

The first member 2 includes the first surface engagement portion 2a and extension portion 2c as described above. The first surface engagement portion 2a has a taper shape including a diameter becoming smaller from the second surface 103c side (rear side) to the first surface 102b side (front side). A largest diameter of this first surface engagement portion 2a is represented as R4. The first surface engagement portion 2a is provided at its top portion with grooves 2e for deforming the first surface engagement portion 2a so as to reduce the diameter thereof. The grooves 2e have a cross shape as illustrated in FIG. 4A. The first surface engagement portion 2a receives a force in the direction of an arrow 4 illustrated in FIG. 4B, thereby elastically deforming the first surface engagement portion 2a so as to reduce the largest diameter R4.

The first member 2 includes the extension portion 2c extending from the first surface engagement portion 2a. The extension portion 2c includes: a thin portion 2c1 close to the first surface engagement portion 2a; and a thick portion 2c2 distant from the first surface engagement portion 2a. The thin portion 2c1 is formed into a thin shape, thereby forming a groove therearound. Further, a step portion 2b is formed at a continuous portion between the thin portion 2c1 and the first surface engagement portion 2a. When the pillar member 102 and the rail member 103 are fastened to each other, the step portion 2b is brought in close contact with the first surface 102b.

Such an extension portion 2c has a taper shape including a diameter becoming smaller from the first surface 102b side (front side) to the second surface 103c side (rear side). For this reason, the first member 2 has a hexagonal shape as illustrated in FIG. 4B when viewed from its side face.

When such a first member 2 receives a compressive force in the direction of an arrow 5 illustrated in FIG. 4C, the first member 2 is elastically deformed so as to expand the largest diameter R4 in the direction of an arrow 6. Therefore, the step portion 2b of the first member 2 is expanded in the side direction, thereby achieving the strong tight of the fastened members (102 and 103).

A description will be given of the second member 3 included in the fastening member holding portion 7 in more detail with reference to FIG. 5.

The second member 3 includes the second surface engagement portion 3a and the screw portion 3b as mentioned above. Further, the second member 3 includes a receiving portion 3c which receives the extension portion 2c provided in the first member 2. This receiving portion 3c has a shape corresponding to the taper shape of the extension portion 2c.

The second surface engagement portion 3a is formed into a flange shape around the second member 3. The diameter R5 of the second surface engagement portion 3a is larger than the diameter R3 of the attachment hole 103b provided in the flange portion 103a of the rail member 103. For this reason, when the pillar member 102 and the rail member 103 are fastened to each other, the second surface engagement portion 3a is brought into close contact with the second surface 103c.

The screw portion 3b threadedly engages the male screw portion 1b of the screw member 1. Further, the screw portion 3b moves the second member 3 in response to the rotation of the screw member 1. Thus, the second member 3 moved in response to the rotation of the screw member 1 can compress the extension portion 2c received within the receiving portion 3c. That is, the extension portion 2c receives a compressive force in the direction of the arrow 5 illustrated in FIG. 4C as mentioned above. As a result, the first surface engagement portion 2a is deformed to expand the largest diameter R4.

Next, a description will be given of the fastening operation of the pillar member 102 and the rail member 103 by use of the fastening device 50 with reference to FIGS. 6 to 9.

Figure 6:
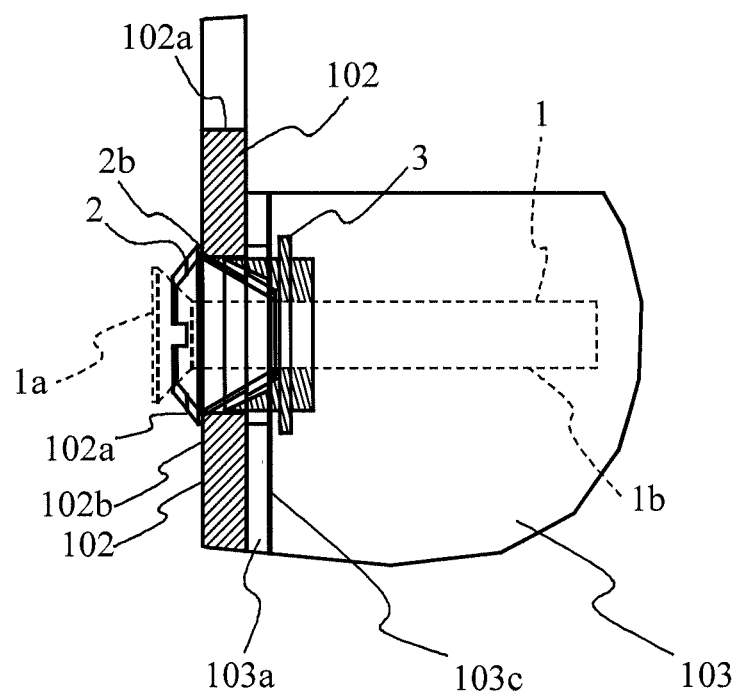
FIG. 6 is a sectional view of the fastening device in the temporary fastened state.
Figure 7:
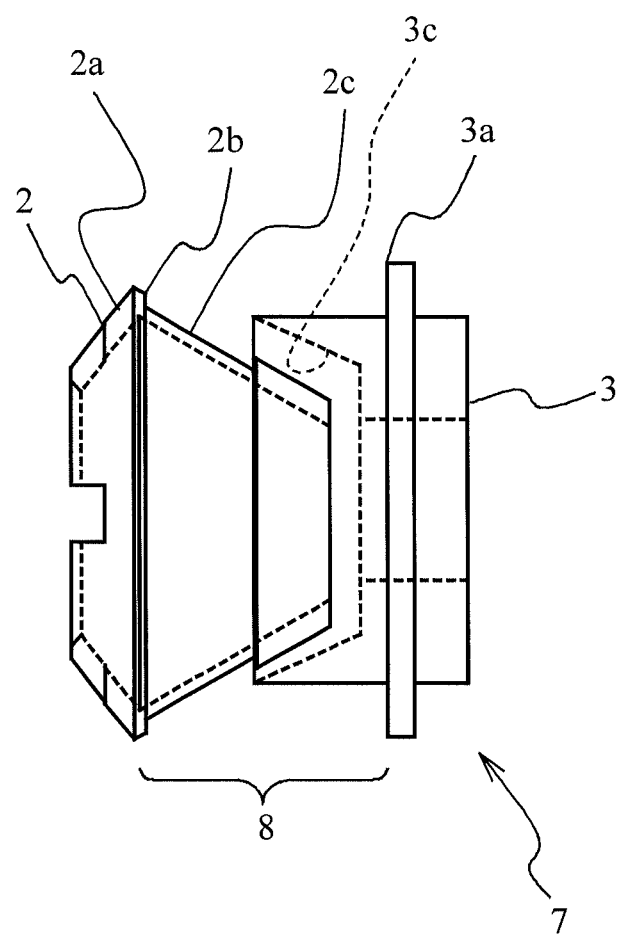
FIG. 7 is an explanatory view of a fastening member holding portion in the temporary fastened state.

In order to fasten the pillar member 102 and the rail member 103 by the fastening device 50, the pillar member 102 and the rail member 103 are brought into a temporary fastened state. FIG. 6 is a sectional view of the fastening device 50 in the temporary fastened state. Also, FIG. 7 is an explanatory view of the fastening member holding portion 7 in the temporary fastened state. In order to achieve the temporary fastened state, an operator attaches the first member 2 and the second member 3 to the male screw portion 1b of the screw member 1 in this order, and then threadedly engages the male screw portion 1b with the screw portion 3b. Thus, the extension portion 2c is to be received within the receiving portion 3c. Such a state forms a clearance 8 between the step portion 2b and the second surface engagement portion 3a as illustrated in FIG. 7. The pillar member 102 and the rail member 103 are tightened and arranged in the clearance 8. However, in this state, the first member 2 and the second member 3 are not brought into close contact with each other.

The pillar member 102 and the rail member 103 are overlapped with each other with the attachment hole 102a and the attachment hole 103b in alignment with each other. Subsequently, the fastening device 50 assembled with the screw member 1, the first member 2, and the second member 3 is penetrated through the attachment hole 103b and the attachment hole 102a in this order. That is, the fastening device 50 where the screw member 1 threadedly engages the screw portion 3b of the second member 3 is penetrated through the attachment holes 103b and 102a from the second surface 103c side to the first surface 102b side. At this time, the head portion 1a of the screw member 1 firstly penetrates through the attachment hole 103b. The pillar member 102 and the rail member 103 are held in the clearance 8 formed in the fastening member holding portion 7 in this way. Therefore, the pillar member 102 and the rail member 103 are brought into the temporary fastened state.

Here, a description will be given of the passing of the first surface engagement portion 2a through the attachment hole 102a. The diameter R1 of the attachment hole 102a is larger than the diameter R2 of the head portion 1 of the screw member 1. Also, the diameter R3 of the attachment hole 103b is larger than the diameter R2 of the head portion 1. This allows the head portion 1 to pass through the attachment hole 103b and the attachment hole 102a.

However, the diameter R4 of the first surface engagement portion 2a is set smaller than the diameter R3 and slightly larger than the diameter R1. Accordingly, the first surface engagement portion 2a may pass through the attachment hole 103b provided in the rail member 103, but may not pass through the attachment hole 102a provided in the pillar member 102 in this current state. Thus, when the operator pushes the first surface engagement portion 2a having a taper shape to the attachment hole 102a, the first surface engagement portion 2a receives a force in the direction of the arrow 4 as illustrated in FIG. 4B. This deforms the first surface engagement portion 2a so as to reduce the diameter R4, whereby the first surface engagement portion 2a passes through the attachment hole 102a. The first surface engagement portion 2a has a taper shape, and includes the grooves 2e, thereby facilitating a reduction in the diameter R4.

The first surface engagement portion 2a has once passed through the attachment hole 102a is returned into a state where the diameter of the first surface engagement portion 2a is the diameter R4 slightly larger than the diameter R1. Therefore, the fastening device 50 does not disengage from the attachment hole 102a and the attachment hole 103b.

In this way, the pillar member 102 and the rail member 103 are held by the fastening member holding portion 7 of the fastening device 50, and are brought into the temporary fastened state. Although the pillar member 102 and the rail member 103 are separated from each other before the temporary fastened state, the positional relationship between the pillar member 102 and once the rail member 103 is maintained after the temporary fastened state is achieved. Thus, the operator is free from holding the rail member 103.

The operator can perform the above mentioned series of operations, that is, can push the rail member 103 to the pillar member 102 and can insert the fastening device 50 from the rail member 103 side.

In contrast, when the pillar member 102 and the rail member 103 are fastened to each other by use of a general bolt and a nut, the bolt has to be penetrated through the attachment hole 102a and the attachment hole 103b from the pillar member 102 side. That is, the bolt has to be penetrated through the attachment hole 102a and the attachment hole 103b from the front side. On the other hand, the rail member 103 is pushed to the pillar member 102 from the rear side. It is thus difficult to penetrate the bolt through the attachment hole 102a and the attachment hole 103b from the front side, while the rail member 103 is being pushed to the pillar member 102 from the rear side. The use of the fastening device 50 of the present embodiment can facilitate to penetrate the fastening device 50 through the attachment hole 102a and the attachment hole 103b.

After the temporary fastened state illustrated in FIG. 6, the screw member 1 is rotated to perform the final fastening operation. When performing the final fastening operation, the operator does not need to hold the rail member 103. This facilitates permanently tightening the screw member 1. Also, the operator can move to the front side of the pillar member 102 to tighten the screw member 1. Thus, also, in view of this point, the operator performs the fastening operation with ease.

Figure 8:
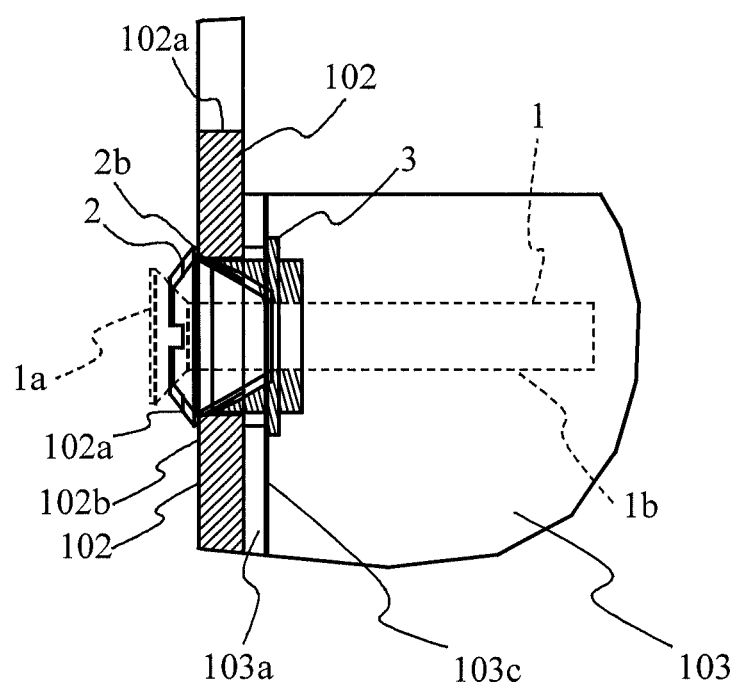
FIG. 8 is a sectional view of the fastening device in the fastened state.
Figure 9:
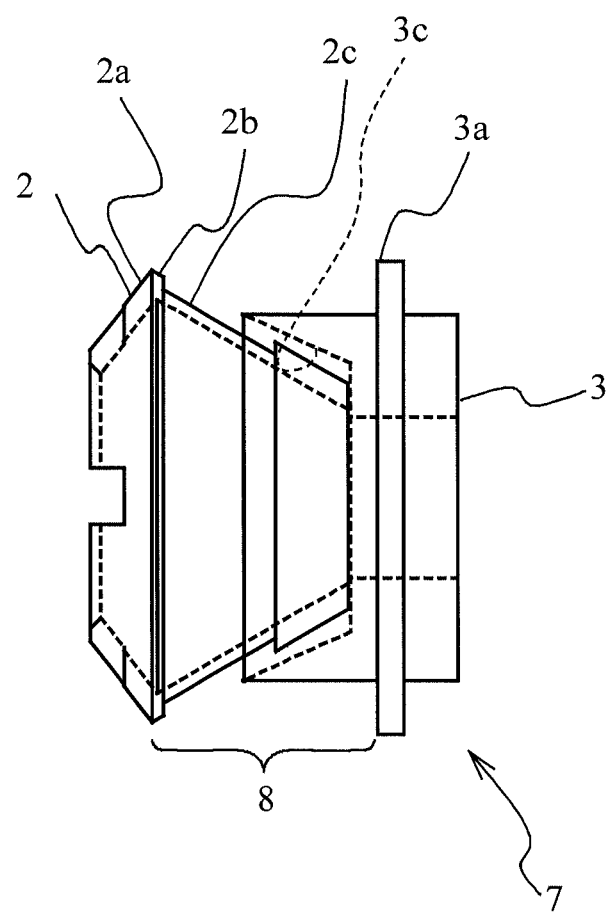
FIG. 9 is an explanatory view of the fastening member holding portion in the fastened state.

FIG. 8 is a sectional view of the state of the fastening device 50 at the time when the screw member 1 is permanently tightened. FIG. 9 is an explanatory view of the fastening member holding portion 7 in the fastened state.

When the operator permanently tightens the screw member 1, the second member 3 with which the male screw portion 1b of the screw member 1 threadedly engaged moves to the rail member 103 side. That is, the second surface engagement portion 3a is moved to the first surface engagement portion 2a side so as to come closer to each other. The first member 2 and the second member 3 is gradually brought into close contact with each other in the receiving portion 3c, and then the clearance 8 becomes narrow as illustrated in FIG. 9. As the clearance 8 becomes narrow, the pillar member 102 and the rail member 103 are sandwiched between the first surface engagement portion 2a and the second surface engagement portion 3a.

Also, at this time, the first surface engagement portion 2a of the first member 2 is engaged with the first surface 102b. In this state, the extension portion 2c is compressed. Therefore, the first member 2 receives a compressive force in the direction of the arrow 5 illustrated in FIG. 4C. Further, the first surface engagement portion 2a is deformed so at to expand the diameter R4. Therefore, the step portion 2b of the first member 2 expands to the sides thereof, thereby achieving the strong tight of the fastened members (102 and 103).

In the above mentioned, the fastening of the pillar member 102 and the rail member 103 is accomplished. In such a way, the fastening device 50 described herein is used, thereby enabling an operator to fasten the pillar member 102 and the rail member 103. The operator repeats such an operation to solely assemble the rack device 100.

Additionally, in order to disassemble the pillar member 102 from the rail member 103, the screw member 1 is rotated to disengage the threaded engagement with the screw portion 3b of the second member 3. Therefore, the screw member 1 and the first member 2 can be pulled out to the front side of the pillar member 102. Because the first member 2 is pulled out to the front side of the pillar member 102, there is no problem that the diameter R4 of the first surface engagement portion 2a of the first member 2 is larger than the diameter R1 of the attachment hole 102a.

The above embodiment has described the fastening of the pillar member 102 and the rail member 103 forming the rack device 100. However, the object to be fastened by the fastening device 50 described herein is not limited to these members. Also, the fastened members is, not limited to two members, and the fastening member can fasten three or more members.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A fastening device for fastening a plurality of members which overlap each other, and each of which includes an attachment hole, the fastening device comprising:
   a screw member penetrating through the attachment holes; and
   a fastening member holding portion,
   wherein the fastening member holding portion comprises:
   a first surface engagement portion positioned at a first surface side of the plurality of members by passing through the attachment holes from a second surface side overlapping each other to the first surface side of the plurality of members overlapping each other, the first surface engagement portion being engaged with the first surface;
   an extension portion extending from the first surface engagement portion to the second surface side as a rear side of the first surface;
   a second surface engagement portion positioned at the second surface side, the second surface engagement portion being engaged with the second surface; and
   a screw portion engaged with the screw member, the second surface engagement portion moving toward the first surface engagement portion side in response to rotation of the screw member and coming contact with the second surface;
   wherein the first surface engagement portion is deformed so as to reduce a length in direction in which the first surface extends when the first surface engagement portion passes through the attachment holes, the first surface engagement portion is deformed so as to expand the length when the first surface engagement portion engages with the first surface, the extension portion is located inside the attachment holes when the first surface engagement portion engages with the first surface and the second surface engagement portion engages with the second surface, the first surface engagement portion has a first taper shape including a diameter becoming smaller from the second surface side to the first surface side, and a second taper shape including a diameter becoming smaller from the first surface side to the second surface side and the second surface engagement portion has a third taper shape corresponding to the second taper shape.

2. The fastening device of claim 1, wherein the extension portion is compressed by moving the second surface engagement portion to the first surface engagement portion side.

3. The fastening device of claim 1, wherein the first surface engagement portion comprises a groove for deforming the first surface engagement portion so as to reduce a diameter of the first surface engagement portion.

4. A casing including a pillar member and a rail member, the casing comprising:
   a fastening device fastening the rail member to the pillar member, with overlapping each other,
   wherein the fastening device comprises:
   a screw member penetrating through attachment holes of the rail member and the pillar member; and
   a fastening member holding portion,
   the fastening member holding portion comprises:
   a first surface engagement portion positioned at a first surface side of the plurality of members by passing through the attachment holes from a second surface side of the rail member and the pillar member overlapping each other to a first surface side of the rail member and the pillar member overlapping each other, then the first surface engagement portion being engaged with the first surface;
   an extension portion extending from the first surface engagement portion to the second surface side as a rear side of the first surface;
   a second surface engagement portion positioned at the second surface side, the second surface engagement portion being engaged with the second surface; and
   a screw portion engaged with the screw member, the second surface engagement portion moving toward the first surface engagement portion side in response to rotation of the screw member and coming contact with the second surface;
   wherein the first surface engagement portion is deformed so as to reduce a length in direction in which the first surface extends when the first surface engagement portion passes through the attachment holes, the first surface engagement portion is deformed so as to expand the length when the first surface engagement portion engages with the first surface, the extension portion is located inside the attachment holes when the first surface engagement portion engages with the first surface and a second surface engagement portion engages with the second surface, the first surface engagement portion has a first taper shape including a diameter becoming smaller from the second surface side to the first surface side, and a second taper shape including a diameter becoming smaller from the first surface side to the second surface side and the second surface engagement portion has a third taper shape corresponding to the second taper shape.

* * * * *